(12) United States Patent
Aiba

(10) Patent No.: US 8,453,567 B2
(45) Date of Patent: Jun. 4, 2013

(54) POSITION MATCHING METHOD AND SCREEN PRINTER

(75) Inventor: Masataka Aiba, Narita (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 567 days.

(21) Appl. No.: 12/307,963

(22) PCT Filed: Jul. 12, 2007

(86) PCT No.: PCT/JP2007/063916
§ 371 (c)(1),
(2), (4) Date: Jan. 8, 2009

(87) PCT Pub. No.: WO2008/007744
PCT Pub. Date: Jan. 17, 2008

(65) Prior Publication Data
US 2009/0199729 A1 Aug. 13, 2009

(30) Foreign Application Priority Data
Jul. 12, 2006 (JP) .................................. 2006-191839

(51) Int. Cl.
*B41M 1/12* (2006.01)

(52) U.S. Cl.
USPC ........... 101/129; 101/123; 101/126; 101/485; 101/486

(58) Field of Classification Search
USPC .................. 101/123, 126, 129, DIG. 36, 481, 101/485, 486
See application file for complete search history.

(56) References Cited

U.S. PATENT DOCUMENTS

| 4,782,751 A | | 11/1988 | Calapinto |
| 5,730,051 A | * | 3/1998 | Takahashi et al. ............. 101/126 |
| 5,752,446 A | * | 5/1998 | Squibb .......................... 101/486 |

(Continued)

FOREIGN PATENT DOCUMENTS

| DE | 10311821 A1 | 9/2004 |
| JP | 03020099 A | 1/1991 |
| JP | 10128951 A | 5/1998 |
| WO | 02/097534 A2 | 12/2002 |

OTHER PUBLICATIONS

International Search Report for PCT/JP2007/063916 dated Oct. 3, 2007.
The Extended European Search Report dated Sep. 1, 2011; Application No./ Patent No. 07790710.3-1251/2039511 PCT/JP2007063916.

*Primary Examiner* — Ren Yan
(74) *Attorney, Agent, or Firm* — Studebaker & Brackett PC; Donald R. Studebaker

(57) ABSTRACT

A printer has a mask sheet 25, a movable print stage 3, a camera head 40 provided with a mask recognition camera 41 and a board recognition camera 42, and a controller that controls the foregoing members. The controller drives the camera head 40 under its control so that mark recognition on a board W is executed using the board recognition camera 42 and mark recognition on the mask sheet 25 is executed periodically a plurality of times using the mask recognition camera 41 while the same mask sheet is used. Also, in order to superimpose the board W on the mask sheet 25, the controller finds a correction amount corresponding to a displacement between the mask sheet 25 and the board W according to latest mask position information acquired through mark recognition on the mask sheet 25 and board position information of the board and drives the print stage 3 according to the correction amount under its control.

7 Claims, 9 Drawing Sheets

U.S. PATENT DOCUMENTS

| | | |
|---|---|---|
| 5,906,158 A | 5/1999 | Takai |
| 6,347,583 B1 * | 2/2002 | Isogai et al. ............ 101/126 |
| 6,490,970 B2 * | 12/2002 | Murakami ............ 101/126 |
| 2003/0021886 A1 | 1/2003 | Baele |

* cited by examiner

POSITION MATCHING METHOD AND SCREEN PRINTER

TECHNICAL FIELD

The present invention relates to a screen printer that prints paste, such as cream solder and conductive paste, onto a board.

BACKGROUND ART

There is generally known a screen printer of a configuration in which a printed wiring board set on a stage is superimposed on a mask sheet and paste, such as cream solder and conductive paste, supplied on the mask sheet is applied (printed) on the printed wiring board at predetermined positions via openings made in the mask sheet by pressing the paste using squeegees.

As is described, for example, in Japanese Patent No. 2682145, a printer of this type is provided with a mask recognition camera mounted to point upward on a movable stage that supports a printed wiring board and takes an image of marks provided on the mask sheet using the mask recognition camera, while it is provided with a board recognition camera provided fixedly to point downward onto the device frame and takes an image of marks on the printed wiring board by allowing the stage to move below the board recognition camera. By checking the relative positional relation of the mask sheet and the printed wiring board on the basis of these images and performing the position matching between the mask sheet and the board, the printed wiring board is superimposed on the mask sheet precisely.

The conventional printer as above executes mark recognition on the printed wiring board (acquisition of printed wiring board position information) for each printed wiring board to be processed, whereas it executes mark recognition on the mask sheet (acquisition of mask position information) only when the mask sheet is attached to the device. This configuration is adopted on the assumption that the position of the mask sheet will not vary.

However, even without any variance in position of the mask sheet, the device as described in the cited reference has a possibility that a travel error (an error from a theoretical amount of travel) occurs in the stage with time due to thermal expansion induced in the drive mechanism while it drives the stage. Accordingly, in a case where printed wiring boards of the same type are produced continuously over a long period, when the position matching between the mask sheet and the printed wiring board is performed according to mask position information acquired through the imaging using the mask recognition camera mounted onto the stage immediately after the production is started and before a travel error occurs in the stage, and printed wiring board position information acquired through the imaging of a printed wiring board W held at the stage using the stationary camera (board recognition camera) after a travel error occurred with an elapse of considerable time for production, there is a displacement comparable to the travel error between the mask sheet and the printed wiring board and print misalignment may possibly occur with time. The prior art, therefore, is susceptible to improvement in this regard.

DISCLOSURE OF THE INVENTION

The invention has been devised in view of the foregoing problems, and has an object to enable the position matching to be performed at a high degree of accuracy over a long period when superimposing a board on a mask sheet and thereby to ensure print accuracy.

In order to achieve the objects, according to the invention, a position matching method is adapted for a screen printer which is operable to superimpose a board held on a print stage on a mask sheet to print paste onto the board via the sheet, comprising acquiring mask position information and board position information through recognition of images of the mask sheet and the board to perform position matching between the mask sheet and the board according to the board position information and the mask position information before the superimposing operation, wherein the mask position information is acquired as an update by performing the recognition of the mask sheet a plurality of times under a pre-set condition while boards of the same type are continuously produced, and the position matching is performed according to latest mask position information acquired during the superimposing operation.

As has been described, while boards of the same type are produced continuously, that is, while the same mask sheet is used, the position matching between the mask sheet and the board is performed using the latest mask position information while the mask position information is kept updated. It thus becomes possible to understand a relative positional relation of the mask sheet and the board more precisely, which enables the position matching between the mask sheet and the board to be performed continuously at a high degree of accuracy.

Meanwhile, a screen printer according to the invention comprises a mask sheet, a movable print stage disposed below the mask sheet to hold a board to be processed, a first imaging device for taking an image of the mask sheet, a second imaging device for taking an image of the board to be processed, a controller for controlling the respective imaging devices so that the image of the board is taken for each board to be processed using the second imaging device and the image of the mask sheet is taken a plurality of times using the first imaging device under a pre-set condition while boards of the same type are produced continuously, a calculator for finding a mask position and a board position according to a result of the taken images, and a storage device for storing the mask position found by the calculator as an update. The controller drives the print stage under control according to the board position found by the calculator and the mask position stored in the storage device in order to superimpose the board held on the print stage on the mask sheet.

According to this printer, the mask position and the board position are recognized by the calculator according to the image of the mask sheet taken by the first imaging device and the image of the board to be processed taken by the second imaging device, and the position matching between the mask sheet and the board is performed as the controller drives the print stage in response to the positional relation under its control. An error may possibly occur in a relative positional relation of the mask sheet and the board due to the influences of thermal expansion in the drive system or the like. In this printer, however, the recognition of the mask sheet is performed a plurality of times and the mask position is stored as an update in the storage device while boards of the same type are produced continuously, and the print stage is driven by the controller under its control according to the board position and the latest mask position stored in the storage device. Accordingly, the position matching between the mask sheet and the board is performed by taking the error as described above into account. It thus becomes possible to perform the position matching method automatically in a satisfactory manner.

As a preferable configuration, the screen printer may further include an imaging head movable between the mask sheet and the print stage in a spaced apart state. The screen printer is configured in such a manner that the first imaging device and the second imaging device are mounted integrally on the imaging head, and that the controller drives the imaging head under control when taking the image of the mask sheet and the image of the board.

When the imaging head is driven repetitively, a travel error (an error from a theoretical amount of travel) may possibly occur in the imaging head due to influences of thermal expansion or the like. In this printer, however, because the print stage is driven by the controller under its control, the position matching between the mask sheet and the board is performed precisely by taking the travel error as described above into account.

In addition, as another preferable configuration, the screen printer may be configured in such a manner that: the first imaging device is integrally movable with the print stage; the second imaging device is provided fixedly within a movable region of the print stage; and the controller drives the print stage under control when taking the image of the mask sheet and the image of the board.

When the print stage is driven repetitively, a travel error (an error from a theoretical amount of travel) may possibly occur in the print stage (first imaging device) due to influences of thermal expansion or the like. In this printer, however, because the print stage is driven by the controller under its control, the position matching between the mask sheet and the board is performed precisely by taking the travel error as described above into account.

BEST MODE FOR CARRYING OUT THE INVENTION

An embodiment of the invention will be described using the drawings.

Figure 1:
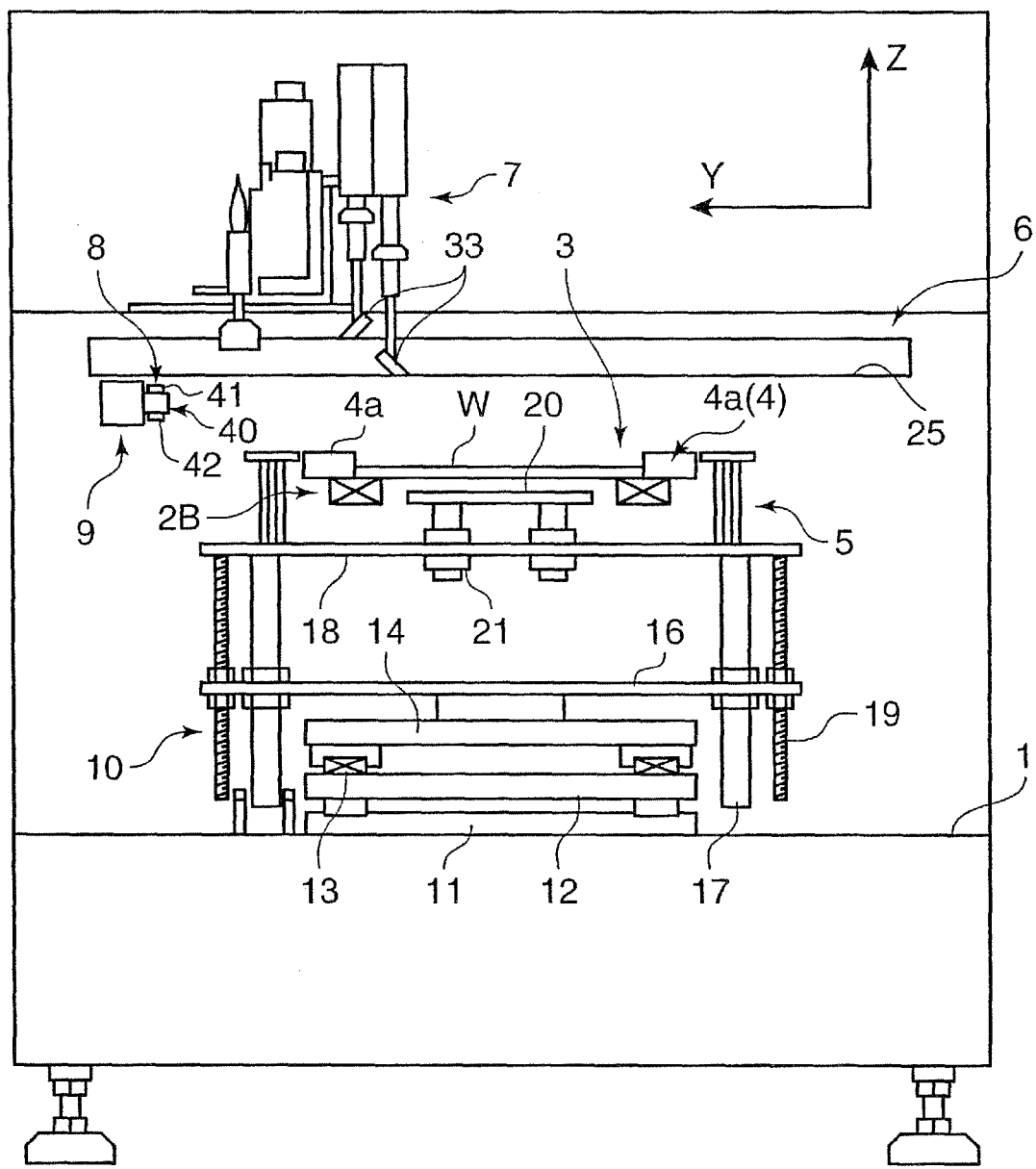
FIG. 1 is a side view showing a screen printer according to the invention (a screen printer that uses a superimposing method of the invention).
Figure 2:
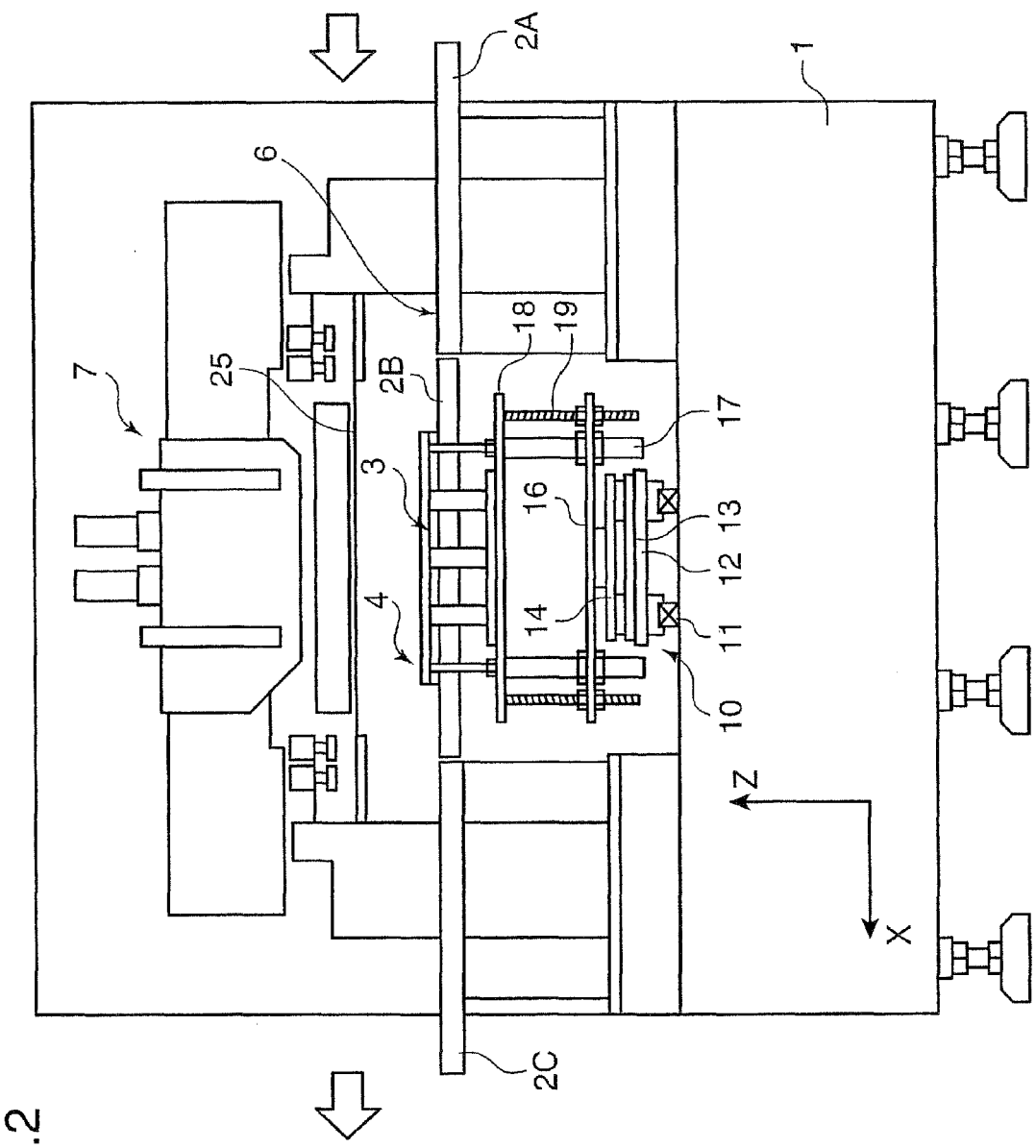
FIG. 2 is a front view showing the screen printer.

FIG. 1 and FIG. 2 schematically show a screen printer according to the invention (a screen printer that uses a position matching method of the invention). FIG. 1 and FIG. 2 are views both showing the screen printer, and FIG. 1 is a side view of a major portion in a state where a cover is removed and FIG. 2 is a front view.

As are shown in these drawings, a print stage 3 is provided on a base stand 1 of the screen printer (hereinafter, referred to simply as the printer). Upstream conveyers 2A and downstream conveyers 2C to carry a printed wiring board W (hereinafter, referred to simply as the board W) in and out from the stage 3 are disposed along a transportation line on the both sides with the print stage 3 in between.

Hereinafter, descriptions will be given on the assumption that a transportation direction of the board W by these conveyers 2A and 2C is an X-axis direction, a direction orthogonal to the X-axis direction on a horizontal plane is a Y-axis direction, and a direction orthogonal to both the X-axis and Y-axis directions is a Z-axis direction.

The print stage 3 holds the board W and positions it with respect to a mask sheet 25 described below from beneath. It is formed of main conveyers 2B, an elevating table 18, and a clamp mechanism 4, and so forth, which will be described below.

The print stage 3 is supported on a four axis unit 10, and is moved in the X-axis, Y-axis, Z-axis, and R-axis (rotations about the Z-axis) by an action of the unit 10.

To be more specific, rails 11 are provided on the base stand 1 along the Y-axis direction within a horizontal plane, and a Y-axis table 12 is attached to the rails 11 in a slidable manner. A ball screw mechanism (not shown) provided on the base stand 1 is coupled to the Y-axis table 12 and it is configured in such a manner that the Y-axis table 12 moves in the Y-axis direction with respect to the base stand 1 as the ball screw mechanism is driven.

Rails 13 are provided on the Y-axis table 12 along the X-axis direction and an X-axis table 14 is attached to the rails 13 in a slidable manner. A ball screw mechanism (not shown) provided on the Y-axis table 12 is coupled to the X-axis table 14 and it is configured in such a manner that the X-axis table 14 moves in the X-axis direction with respect to the Y-axis table 12 as the ball screw mechanism is driven.

An R-axis table 16 is provided to the X-axis table 14 in a rotatable manner about the axial line in the Z-axis direction, and the R-axis table 16 is driven to rotate about the Z-axis with respect to the X-axis table 14 by unillustrated drive means.

Slide supporting columns 17 are attached to the R-axis table 16 in a slidable manner along a top-bottom direction (Z-axis direction), and an elevating table 18 is attached to the top portions of the slide supporting columns 17. A ball screw mechanism 19 is provided between the elevating table 18 and the R-axis table 16, and it is configured in such a manner that the elevating table 18 moves in the Z-axis direction (top-bottom direction) with respect to the R-axis table 16 while being guided by the slide supporting columns 17 as the ball screw mechanism 19 is driven.

As has been described, it is configured in such a manner that the four axis unit 10 moves the print stage 3 in the X-axis, Y-axis, Z-axis, and R-axis (rotations about the Z-axis) by driving the respective tables 12, 14, 16, and 18 individually.

A pair of main conveyers 2B is provided on the elevating table 18 along the X-axis direction and a clamp mechanism 4, a positioning mechanism 5, a placement table 20, and so forth are also provided thereon. As described above, in this embodiment, the elevating table 18, the main conveyers 2B, and so forth together form the print stage 3 to hold the board W.

It is configured in such a manner that the main conveyers 2B move integrally with the elevating table 18 as it ascends and descends and when the elevating table 18 is set at the predetermined home position (the descent end position and the predetermined origin position in the X-axis, Y-axis, and R-axis directions), they are lined up with the upstream conveyers 2A and the downstream conveyers 2C in the X-axis direction. When the elevating table 18 is set to the home position in this manner, the board W is carried in the print stage 3 (onto the main conveyers 2B) from the upstream conveyers 2A and the board W is carried out from the print stage 3 onto the downstream conveyers 2C.

The clamp mechanism 4 fixedly holds the board W during an operation and has a pair of clamp pieces 4a that are allowed to come closer to and move apart from each other in the Y-axis direction. It is configured in such a manner that the board W is fixed by pinching it using these clamp pieces 4a from the both sides in the Y-axis direction. The clamp mechanism 4 uses an air cylinder as the drive source, and it is configured in such a manner that the clamp mechanism 4 can be switched by an action of the air cylinder between a clamp state in which the clamp pieces 4a are in close proximity to each other and a clamp release state in which both the clamp pieces 4a are spaced apart from each other.

Although it is not shown in detail in the drawing, the positioning mechanism 5 positions the board W by regulating deflection or the like of the board W before the clamp mechanism 4 clamps the board W.

The placement table 20 supports the board W by lifting up the board W on the main conveyers 2B from beneath. The placement table 20 is supported on the elevating table 18 by slide supporting columns 21 in an ascendible and descendible manner and coupled to a ball screw mechanism (not shown) provided between the table 20 and the elevating table 18. It is configured in such a manner that the placement table 20 moves in the Z-axis direction (top-bottom direction) with respect to the elevating table 18 as the ball screw mechanism is driven.

Meanwhile, a mask holding unit 6, a squeegee unit 7, an imaging unit 8, a cleaner 9, and so forth are disposed above the print stage 3.

Figure 3:
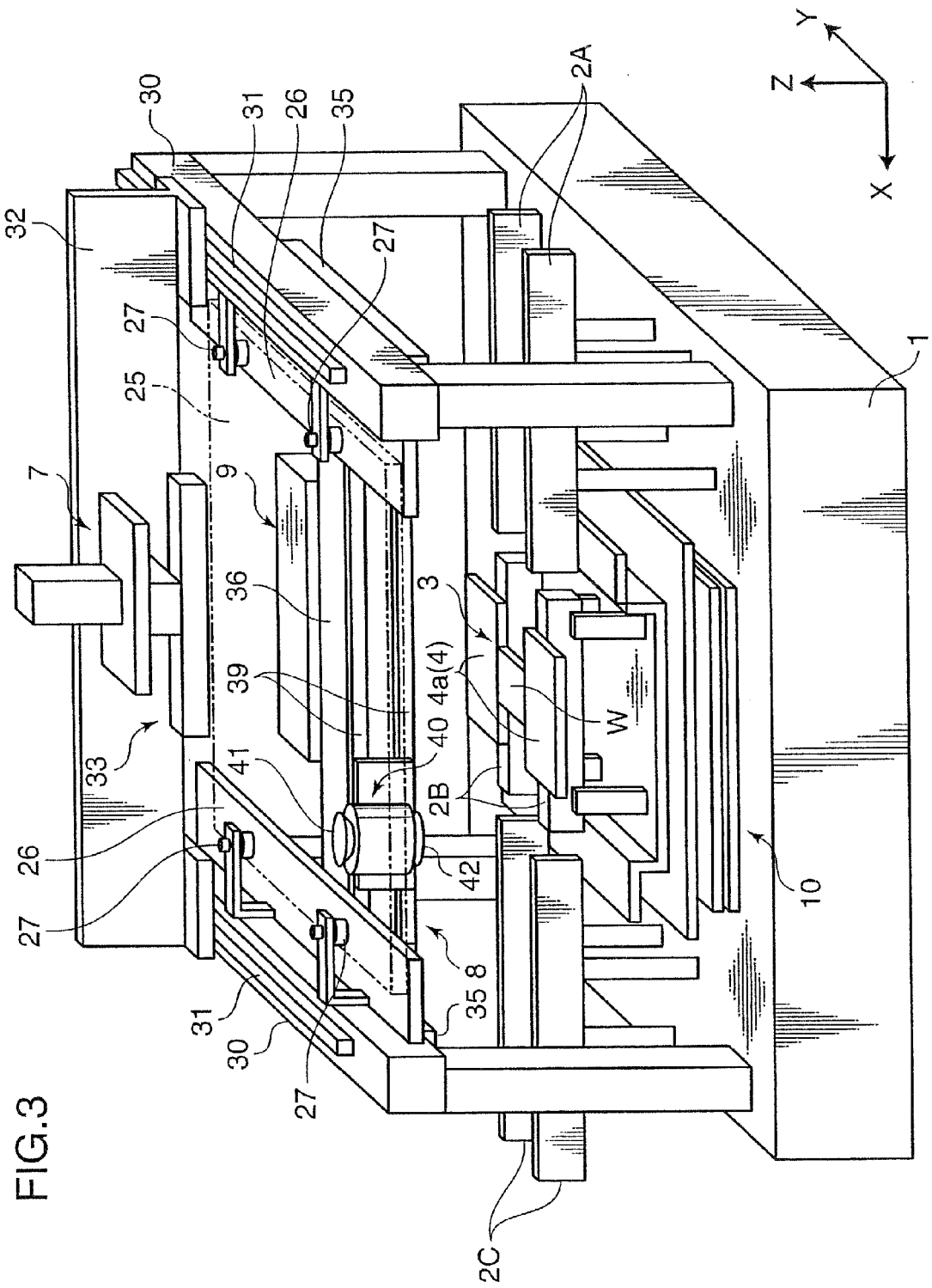
FIG. 3 is a perspective view showing the screen printer.
Figure 4:
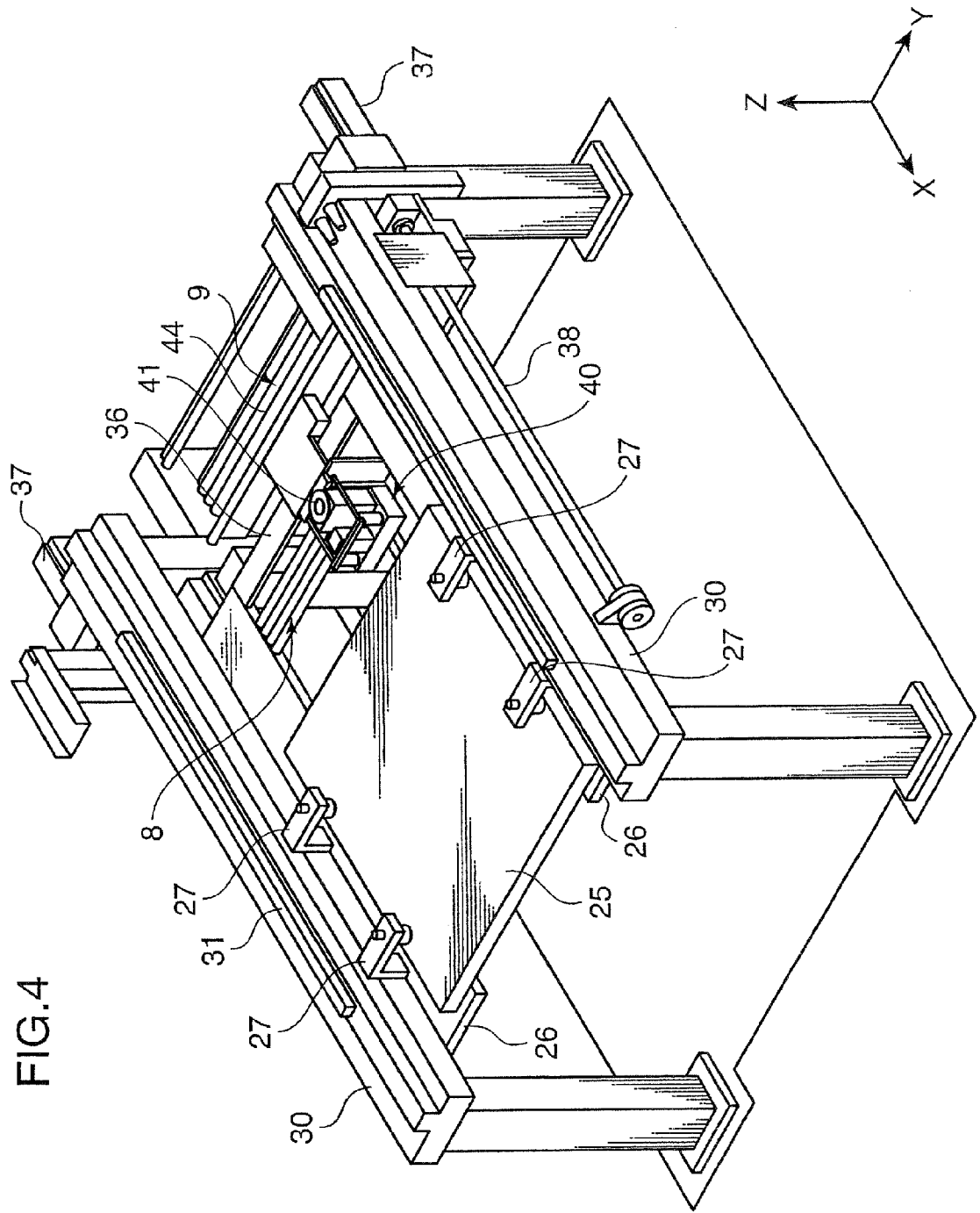
FIG. 4 is a perspective view of the screen printer in a state where a squeegee unit 7 is removed.

The mask holding unit 6 holds a mask sheet 25. As are shown in FIG. 3 and FIG. 4, the mask holding unit 6 has mask holding stands 26 fixed to a pair of bridge-shaped frames 30 supported on the base stand 1. It is configured in such a manner that mask holding unit 6 holds the mask sheet 25 in a horizontally stretched state above the print stage 3 by clamping the frame portion of the mask sheet 25 using mask clamps 27 provided to the mask holding stands 26.

The squeegee unit 7 spreads paste, such as cream solder and conductive paste, across the mask sheet 25 while rolling (kneading) the paste.

The squeegee unit 7 includes rails 31 fixed onto the respective frames 30 and extending in the Y-axis direction, a beam 32 attached to bride between these rails 31 and moved in the Y-axis direction by an unillustrated drive mechanism, a pair of squeegees 33 and 33 to spread paste across the mask sheet 25, and elevating mechanisms provided to the beam 32 and allowing the corresponding squeegees 33 and 33 to ascend and descend individually. It is configured in such a manner that the paste is spread across the mask sheet 25 during a printing operation by allowing the squeegees 33 and 33 to slide along the surface of the mask sheet 25 alternately while the beam 32 is reciprocating in the Y-axis direction.

The imaging unit 8 takes images of the board W and the mask sheet 25 and provided at the lower end of the mask holding unit 6.

The imaging unit 8 includes a camera head 40 (corresponds to an imaging head) integrally equipped with a mask recognition camera 41 and a board recognition camera 42 and a drive mechanism that moves the camera head 40. It is configured in such a manner that images of the mask sheet 25 and the board W are taken by moving the camera head 40 in a planar manner in the X-axis direction and in the Y-axis direction.

To be more specific, a pair of rails 35 each extending in the Y-axis direction is provided to the undersurfaces of the respective frames 30 and a beam 36 extending in the X-axis direction is attached to these rails 35 in a movable manner while being supported on the frames 30. Also, ball screw shafts 38 driven to rotate by corresponding motors 37 are threaded and inserted into unillustrated nut portions of the beam 36. In addition, a pair of rails 39 extending in the X-axis direction is provided to the beam 36. The camera head 40 is attached to these rails 39 in a movable manner and an unillustrated motor-driven ball screw shaft mounted on the beam 36 is threaded and inserted into an unillustrated nut portion of the camera head 40. In other words, it is configured in such a manner that the beam 36 moves in the Y-axis direction with respect to the frames 30 and the camera head 40 moves in the X-axis direction with respect to the beam 36 in association with rotations of the corresponding ball screw shafts, which allows the camera head 40 to move in a planar manner across a printing work area WE and an outside area (evacuation area) described below.

Each of the mask recognition camera 41 and the board recognition camera 42 is formed of a CCD camera or the like provided with illumination. Of these cameras, the mask recognition camera 41 (corresponds to first imaging device) is provided to point upward in order to take an image of position recognition marks (not shown) provided on the undersurface of the mask sheet 25 and an image of dirt on the mask sheet 25 when necessity arises. On the contrary, the board recognition camera 42 (corresponds to second imaging device) is provided to point downward in order to take an image of position recognition marks provided on the board W. These cameras 41 and 42 are provided to the camera head 40 to be vertically symmetrical so that the respective optical axes are aligned coaxially. Owing to this configuration, it is possible to take images of different subjects from above and below at the same position (coordinate position) on the X-Y coordinate plane.

The cleaner 9 cleans the mask sheet 25 from the undersurface side and is integrally attached to the beam 36 of the imaging unit 8.

The cleaner 9 has a cleaning head 44 that is driven to ascend and descend by an unillustrated drive mechanism. It is configured in such a manner that the cleaning head 44 is set at the ascent position during a cleaning operation and the mask sheet 25 is cleaned by bringing the head 44 into sliding contact with the mask sheet 25 in association with the movement of the beam 36. Although it is not shown in detail in the drawing, the cleaning head 44 holds a roll of wiping paper and it is configured in such a manner that residual paste or the like on the undersurface and in the openings of the mask sheet is wiped out by letting the residual paste be absorbed in the wiping paper pulled out from the roll.

The printer has an unillustrated controller provided with a known CPU or the like that performs a logical operation. Various actuators, such as the motors 37 of the imaging unit 8, the unillustrated motor that drives the camera head 40 in the X-axis direction, the respective drive devices of the X-axis, Y-axis, Z-axis, and the R-axis of the four axis unit 10, and the elevating devices of the respective conveyers 2A, 2B, and 2C and the respective squeegees 33 and 33 are all controlled systematically by the controller.

Also, image data acquired by the mask recognition camera 41 and the board recognition camera 42 is transmitted to the controller, so that various types of processing, such as recognition, computation, and storage, according to the image data are performed by the controller. In short, in this embodiment, the controller functions as controller, calculator, and storage device of the invention.

Figure 5:
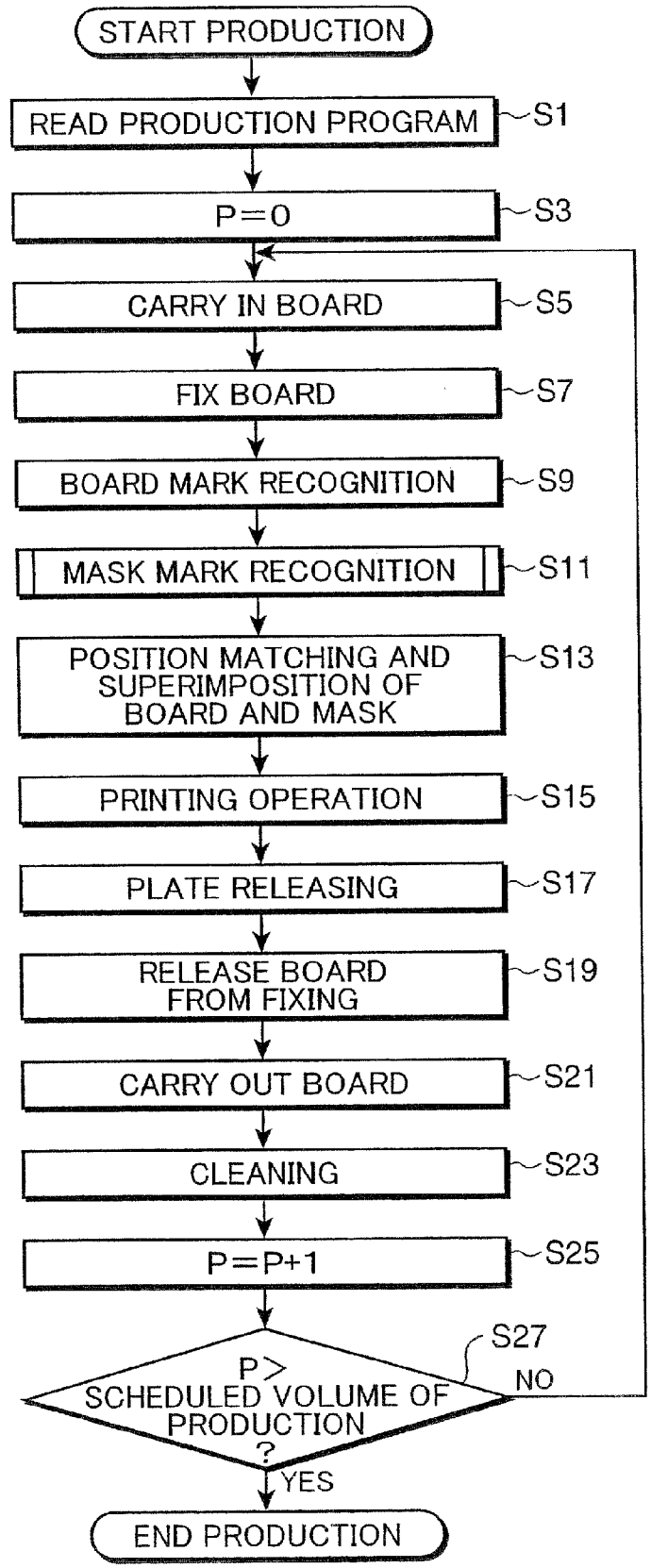
FIG. 5 is a flowchart (main routine) showing an example of printing operation control.
Figure 6:
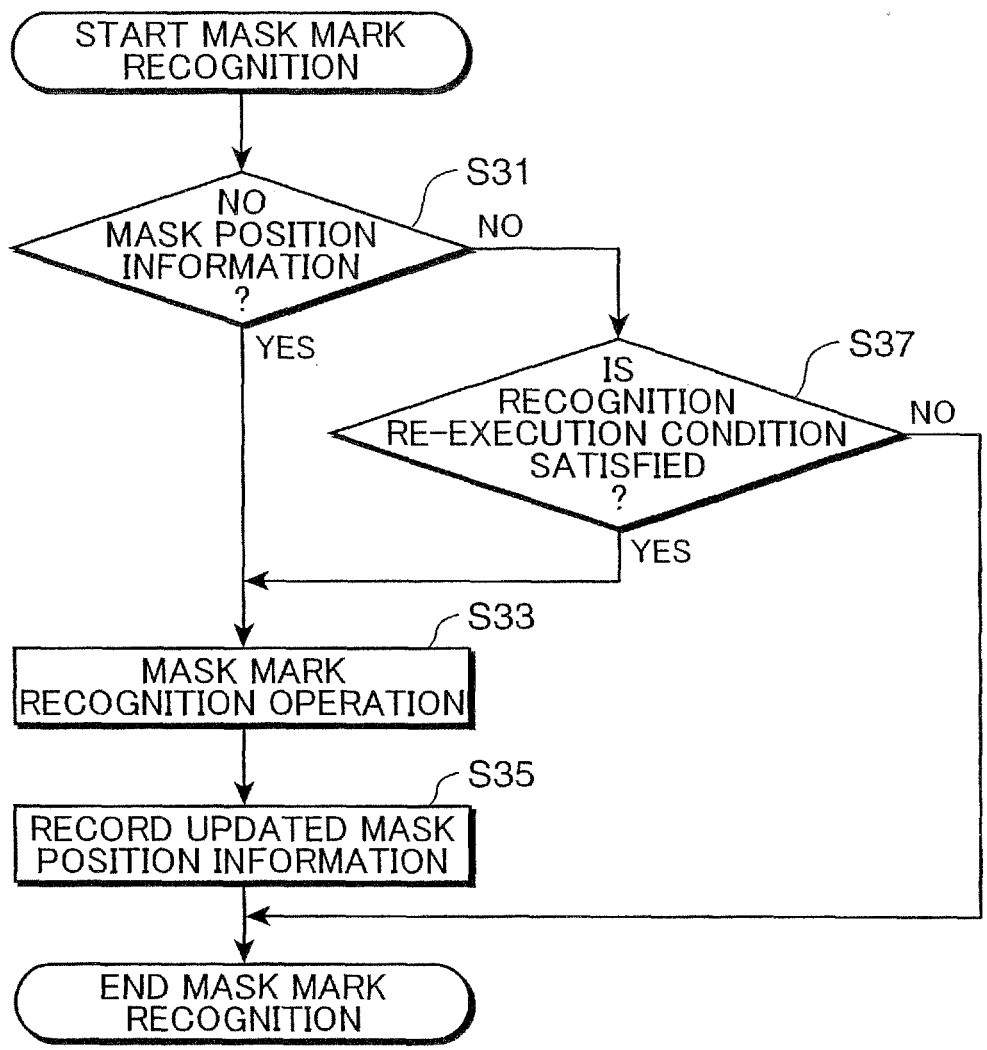
FIG. 6 is another flowchart (sub-routine) showing the example of printing operation control.

The printing operation control by the controller will now be described according to the flowcharts of FIG. 5 and FIG. 6.

When the production is started by the printer, the controller first reads out the production program corresponding to the board W and sets the initial value "0" to the counter (Steps S1 and S3). In this instance, the print stage 3 is set at the home position without holding the board W (a state where the elevating table 18 is set at the home position in the four axis unit 10). Also, as indicated by an alternate long and two short dashes line in FIG. 7, the camera head 40 is set at the predetermined home position HP on the outside of the printing work area WE. In addition, the squeegee unit 7 is set at the predetermined home position while both the squeegees 33 and 33 are held at the ascent positions.

Figure 7:
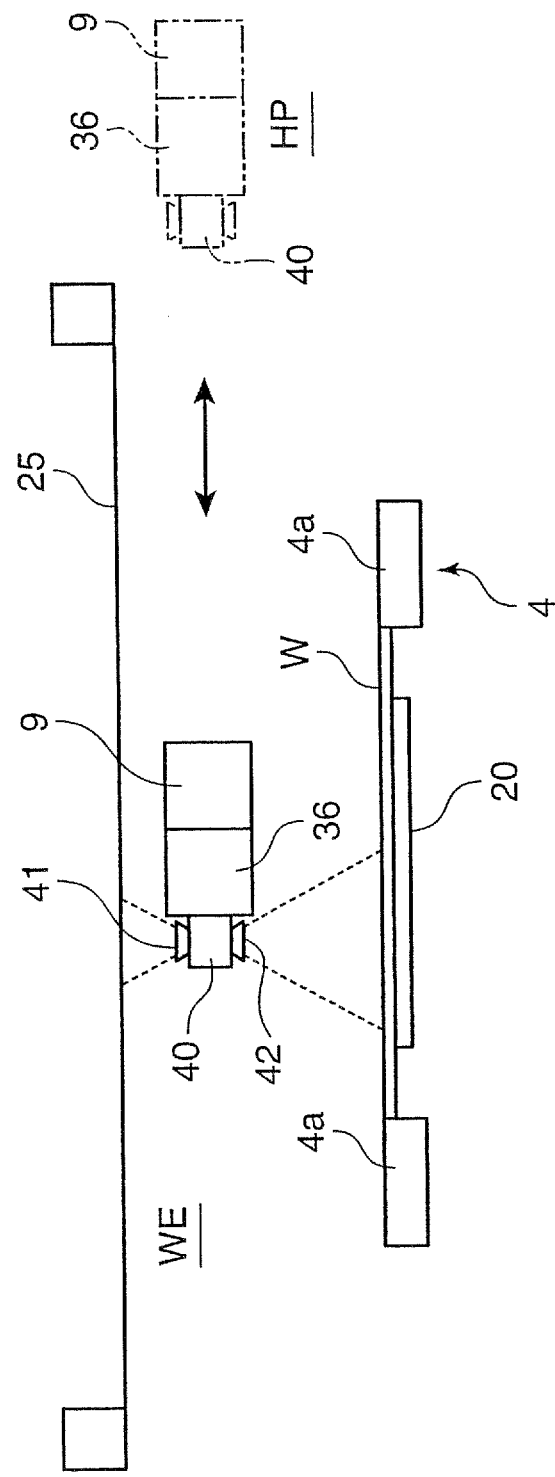
FIG. 7 is a view schematically showing a state during a printing operation (a state where a camera head has moved to a printing work area).

Subsequently, the controller carries the board W in onto the print stage 3 by driving the conveyers 2A and 2B and fixes the board W thereon (Step S5). In order to fix the board W on the print stage 3, the board W carried in onto the main conveyers 2B is lifted up by causing the placement table 20 to ascend first and thence the board W is pinched using the clamp mechanism 4 while positioning the board W using the positioning mechanism 5. Accordingly, as is shown in FIG. 7, the board W is held in a horizontal posture in a state where it is supported on the placement table 20 from beneath and pinched from the both sides by the clamp mechanism 4.

When the board W is fixed onto the print stage 3, the controller executes mark recognition processing on the board W by driving the camera head 40 (Step S9). During this processing, as is indicated by a solid line in FIG. 7, the camera head 40 moves from the home position HP to the printing work area WE. Accordingly, not only the image of the marks formed on the board W is taken by the board recognition camera 42, but also the image data is outputted to the controller. The controller then finds the position (coordinate) of the board W according to the image data.

Subsequently, the controller executes mark recognition processing on the mask sheet 25 (Step S11). This processing follows the sub-routine in FIG. 6.

Initially, the controller determines whether the mask position information has been already acquired, in other words, whether mark recognition on the mask sheet 25 has been already executed (Step S31). In a case where the mask position information has not been acquired, the controller executes the mark recognition operation on the mask sheet 25 (Step S33). Accordingly, this operation is always executed immediately after a new mask sheet 25 is set to the mask holding unit 6 and the production is started. To be more specific, the image of the marks is taken by the mask recognition camera 41 as the camera head 40 moves below the mask sheet 25 and the image data is outputted to the controller (see FIG. 7).

Upon executing the mark recognition operation, the controller finds the position (coordinate) of the mask sheet 25 according to the image data. After the controller has stored the computed position as the mask position information, it ends the processing by the sub-routine.

On the contrary, upon determining "NO" in Step S31, the controller further determines whether a mark recognition re-execution condition is satisfied (Step S37). Upon determining that the condition is satisfied, the controller proceeds to Step S33 and executes the mark recognition operation as described above. In this case, the controller stores updated mask position information by writing over the newly found mask position information. Meanwhile, upon determining "NO" in Step S31, the controller ends the sub-routine without executing the mark recognition operation.

In this embodiment, the mark recognition re-execution condition is set to a condition under whish the mark recognition operation on the sheet 25 is executed a plurality of times while the same type of boards W are produced, that is, while the same mask sheet 25 is used continuously. To be more specific, a time interval to execute the mark recognition operation is set as the execution condition.

Figure 8:
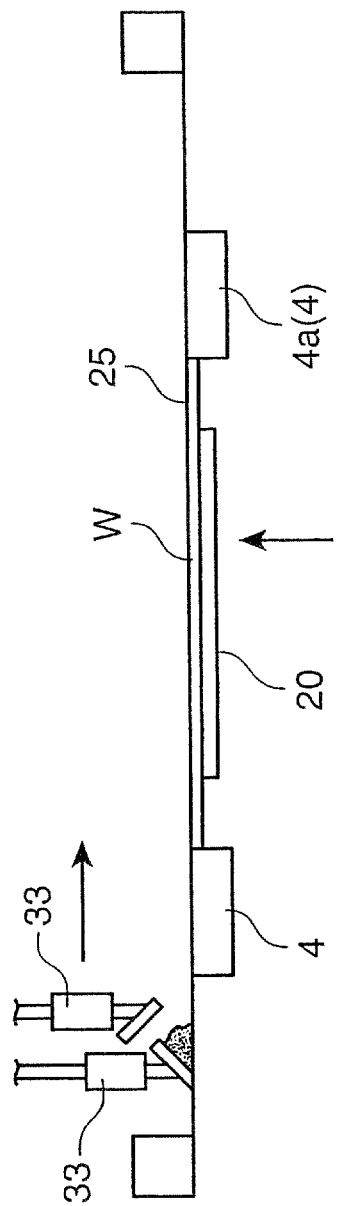
FIG. 8 is a view schematically showing another state during the printing operation (a state where a preparation for printing is completed).

Referring to FIG. 5 again, when the mark recognition processing ends, the controller resets the camera head 40 from the printing work area WE to the home position HP (see the alternate long and two short dashes line in FIG. 7), and performs the position matching between the mask sheet 25 and the board W in the X-axis and in the Y-axis directions by driving the four axis unit 10. Thereafter, as is shown in FIG. 8, the controller superimposes the board W on the mask sheet 25 from beneath (Step S13). In this instance, the controller finds a relative displacement between the mask sheet 25 and the board W in the X-axis and Y-axis directions according to the board position information stored in Step S5 and the mask position information stored in Step S35 (that is, the latest mask position information) and computes a correction amount corresponding to the displacement. The controller then performs the position matching of the board W with respect to the mask sheet 25 by driving the four axis unit 10 or the like according to the correction amount under its control.

Subsequently, the controller executes a printing operation by driving the squeegee unit 7 (Step S15). To be more specific, the controller moves the squeegee unit 7 to the predetermined printing start position and presses one of the squeegees 33 against the surface of the mask sheet 25. After the paste is supplied onto the mask sheet 25, the controller spreads the paste by driving the squeegee 33 in the Y-axis direction and thereby prints (applies) the paste onto the board W via openings in the mask sheet 25.

When the printing operation ends, the controller releases (plate releasing) the board W from the mask sheet 25 by causing the print stage 3 to descend slightly, and then resets the print stage 3 swiftly to the home position (Step S17).

When the print stage 3 is reset to the home position, the controller releases the board W from the fixing by the clamp mechanism 4 and further carries out the board W by driving the conveyers 2B and 2C (Steps S19 and S21). In addition, the controller performs the cleaning operation of the mask sheet 25 (Step S23). To be more specific, the controller brings the cleaning head 44 into sliding contact with the mask sheet 25 from beneath by driving the imaging unit 8 (beam 36) for the cleaner 9 to reciprocate in the Y-axis direction integrally with the imaging unit 8.

When the cleaning operation for the mask sheet 25 ends in this manner, the controller increments the counter value by one and determines whether the count value exceeds a scheduled volume of production, that is, whether the processing is completed for as many boards W as the production volume (Step S27). When the processing has not been completed, the controller returns to Step S5 and starts the processing on the next board W. Upon finally determining the completion of the processing for as many boards W as the scheduled volume of production (YES in Step S27), the controller ends the production of the boards W of this type.

As has been described, the printer is configured in such a manner that it executes the mark recognition operation on the mask sheet 25 each time a predetermined time has elapsed and stores the recognition result (mask position information) as an update while the boards W of the same type are produced, that is, while the same mask sheet 25 is used (from the start of production to the end of production) (Steps S37 and S33, and S35). Accordingly, even when the production period is relatively long, it is possible to maintain a high degree of position matching accuracy of the board W with respect to the mask sheet 25. More specifically, once the mask position information is acquired, this mask position information may be used continuously during the production period as with the conventional printer of this type. In this case, however, a travel error (an error from a theoretical amount of travel) may possibly occur with time due to thermal expansion induced in the drive mechanism (ball screw shafts 38 or the like) of the camera head 40 while the camera head 40 is driven repetitively, which poses the following problems. That is, when the position matching between the mask sheet 25 and the board W is performed according to the mask position information acquired through the imaging using the camera head 40 immediately after the mask sheet 25 is set and before a travel error occurs and the board position information acquired through the imaging using the camera head 40 after the travel error occurred with an elapse of considerable time for production, there is a displacement comparable to the travel error between the mask sheet 25 and the board W. It thus becomes difficult to perform the position matching precisely. The printer of this embodiment, however, updates the mask position information periodically by executing the mark recognition operation on the mask sheet 25 at every predetermined time. It thus becomes possible to perform the position matching between the mask sheet 25 and the board W by taking the travel error as described above into account.

Hence, even in a case where boards W of the same type are produced continuously over a long period, it is possible to maintain a high degree of position matching accuracy over a long period when superimposing boards on the mask sheet, which consequently makes it possible to maintain a high degree of print accuracy.

The mark recognition operation on the mask sheet 25 may be performed for each board as with the mark recognition operation on the board W. However, the recognition operation re-execution condition is set purposely so that the mark recognition operation is executed only when this condition is satisfied for the following reasons. Firstly, because a travel error of the camera head 40 occurring due to thermal expansion is not an error that varies markedly in a short time, it is possible to ensure the reliability of the mask position information by performing the mark recognition operation periodically at regular time intervals. Secondly, performing the mark recognition operation on the mask sheet 25 for each board can decrease the throughput, and the productivity is unnecessarily sacrificed. Accordingly, the printer described above has advantages that the boards W can be produced rationally by ensuring the print accuracy and by ensuring the productivity in good balance.

Incidentally, in this embodiment, the predetermined time is set as the execution condition of the mark recognition operation on the mask sheet 25 (the recognition re-execution condition in Step S37 of FIG. 6), and the mark recognition operation is executed each time this specific time has elapsed. The execution condition, however, may be set as follows. That is, the mark recognition operation may be executed under the conditions: (1) whether a printing operation has been performed a predetermined number of times, (2) whether the camera head 40 has axially moved by a predetermined distance or more, (3) whether the camera head 40 has axially moved a predetermined number of times, (4) whether a temperature has changed to a predetermined temperature or above, and so forth. Regarding the temperature cited in (4) above, temperature detection means for detecting a temperature in a driving mechanism of the camera head 40, for example, bearing portions of the ball screw shafts 38 may be provided to make a determination according to the detected temperature.

Also, this embodiment is configured in such a manner so as to take into account a travel error occurring due to thermal expansion mainly in the drive mechanism (ball screw shafts 38 or the like) that drives the camera head 40. It is, however, possible that thermal expansion induced in the drive mechanism of the four axis unit 10 (the ball screw shaft incorporated into the four axis unit 10 or the like) causes a travel error (an error from a theoretical amount of travel) in the print stage 3 with time. Accordingly, it may be configured in such a manner so as to take a travel error in the print stage 3 into account as well.

To be more specific, at least a pair of marks is provided on the print stage (marks provided on the board W may be used), and images of these marks are successively taken using the board recognition camera 42 by moving the print stage 3 side while the camera head 40 is disposed within the printing work area WE. A travel error of the print stage 3 is then found according to the positions of the both marks on the image, and position matching between the mask sheet 25 and the board W may be performed by taking this travel error into account. According to this configuration, because the travel error on the print stage 3 side is also taken into account, it becomes possible to perform the position matching when superimposing the board on the mask sheet 25 at a higher degree of accuracy. In this case, the condition same as the mark recognition re-execution condition on the mask sheet 25 or a different mark recognition execution condition is set and the mark recognition operation is executed when the condition is satisfied. The result (error information) is stored as an update, so that the position matching between the mask sheet 25 and the board W can be performed by taking the latest error information into account.

The printer described above is provided with the camera head 40 on which the mask recognition camera 41 and the board recognition camera 42 are integrally mounted, and recognition of the respective marks on the mask sheet 25 and the board W is performed by moving the camera head 40 in a portion between the board W held on the print stage 3 and the mask sheet 25 (printing work area WE). However, besides this configuration, the invention is also applicable to a printer of the configuration described in the background art.

Figure 9:
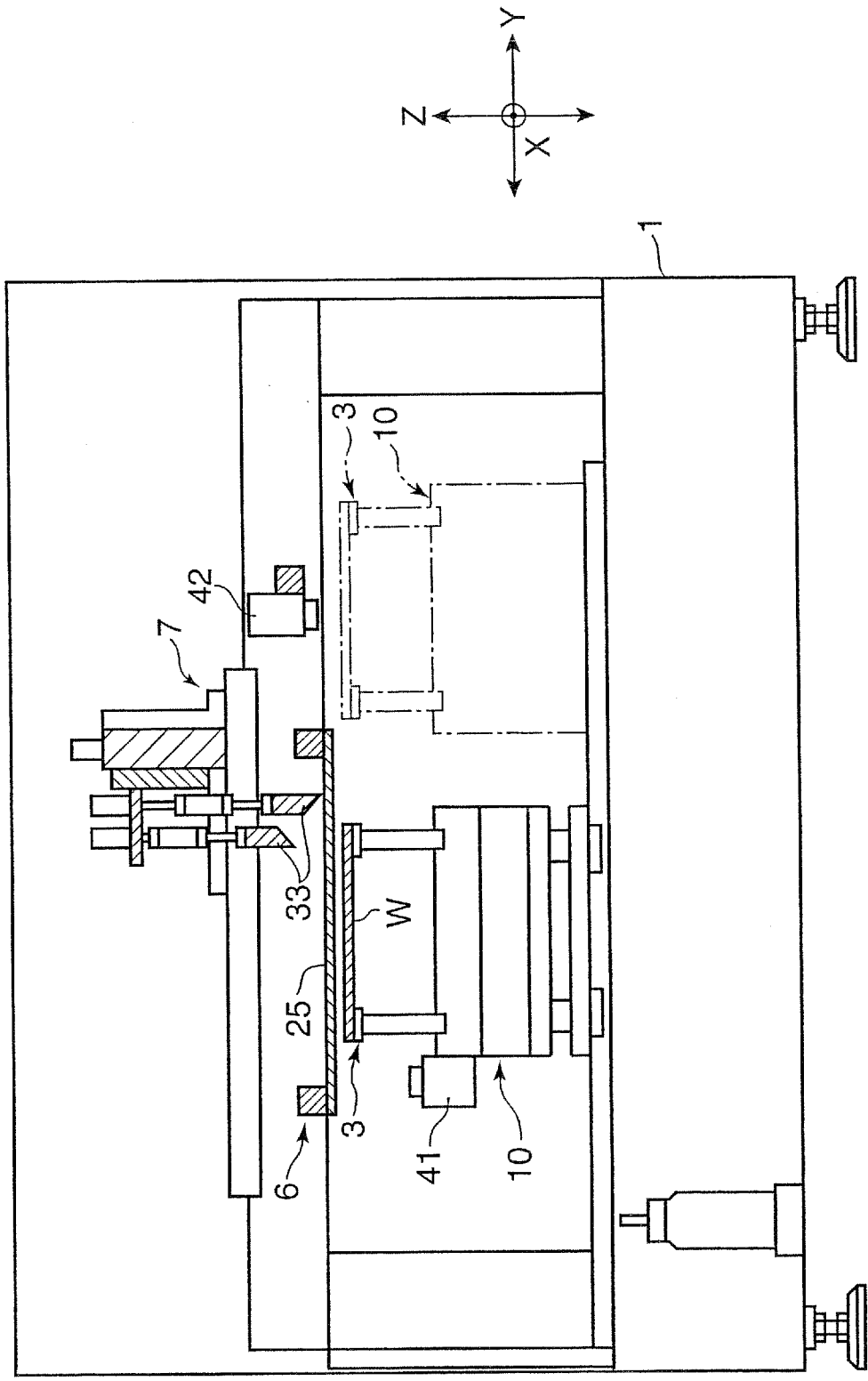
FIG. 9 is a side view of another screen printer according to the invention (a screen printer that uses the superimposing method of the invention).

To be more specific, the invention is also applicable to a screen printer configured in such a manner that, as is shown in FIG. 9 (portions common with those in the device shown in FIG. 1 and the like are labeled with the same reference numerals), the mask recognition camera 41 (corresponds to first imaging device) is mounted to point upward on the four axis unit 10 in a portion that moves integrally with the print stage 3 to take an image of marks on the mask sheet 25 by moving the mask recognition camera 41 integrally with the print stage 3, while the board recognition camera 42 (corresponds to second imaging device) is provided fixedly to point downward onto the device frame to take an image of marks on the board W by moving the print stage 3 below the board recognition camera 42.

More specifically, in the case of this printer, too, a travel error (an error from a theoretical amount of travel) may possibly occur in the print stage 3 with time due to thermal expansion induced in the drive mechanism of the four axis unit 10. In this case, by performing position matching between the mask sheet 25 and the board W according to the mask position information acquired through the imaging using the mask recognition camera 41 mounted on the stage 3 immediately after the mask sheet 25 is set and before a travel error occurs in the print stage 3 and the board position information acquired through the imaging of the board W held on the print stage 3 using the stationary camera (board recognition camera 42) after a travel error occurred with an elapse of considerable time for production, a displacement comparable to the travel error occurs between the mask sheet 25 and the board W. Accordingly, even in the case of the configuration as above, by updating the mask position information periodically by performing the mark recognition operation on the mask sheet 25 at every predetermined time in accordance with the flowcharts of FIG. 5 and FIG. 6, it is basically possible to perform position matching between the mask sheet 25 and the board W at a high degree of accuracy over a long period.

The invention described above can be summarized as follows.

Specifically, a position matching method according to the invention is adapted for a screen printer which is operable to superimpose a board held on a print stage on a mask sheet to print paste onto the board via the sheet, comprising acquiring mask position information and board position information through recognition of images of the mask sheet and the board to perform position matching between the mask sheet and the board according to the board position information and the mask position information before the superimposing operation, wherein the mask position information is acquired as an update by performing the recognition of the mask sheet a plurality of times under a pre-set condition while boards of the same type are continuously produced, and the position matching is performed according to latest mask position information acquired during the superimposing operation.

According to this method, while boards of the same type are produced continuously, that is, while the same mask sheet is used, the position matching between the mask sheet and the board is performed using the latest mask position information while the mask position information is kept updated. It thus becomes possible to understand a relative positional relation of the mask sheet and the board more precisely, which enables the position matching between the mask sheet and the board to be performed at a high degree of accuracy continuously.

Meanwhile, a screen printer according to the invention comprises a mask sheet, a movable print stage disposed below the mask sheet to hold a board to be processed, a first imaging device for taking an image of the mask sheet, a second imaging device for taking an image of the board to be processed, a controller for controlling the respective imaging devices so that the image of the board is taken for each board to be processed using the second imaging device and the image of the mask sheet is taken a plurality of times using the first imaging device under a pre-set condition while boards of the same type are produced continuously, a calculator for finding a mask position and a board position according to a result of the taken images; and a storage device for storing the mask position found by the calculator as an update, wherein the controller drives the print stage under control according to the board position found by the calculator and the mask position stored in the storage device in order to superimpose the board held on the print stage on the mask sheet.

According to this printer, the mask position and the board position are recognized by the calculator according to the image of the mask sheet taken by the first imaging device and the image of the board to be processed taken by the second imaging device, and the position matching between the mask sheet and the board is performed as the controller drives the print stage in response to the positional relation under its control. It thus becomes possible to perform the position matching method automatically in a satisfactory manner.

As a preferable configuration, the screen printer may further include an imaging head movable between the mask sheet and the print stage in a spaced apart state and configured in such a manner that the first imaging device and the second imaging device are mounted integrally on the imaging head, and that the controller drives the imaging head under control when taking the image of the mask sheet and the image of the board.

When the imaging head is driven repetitively, a travel error (an error from a theoretical amount of travel) may possibly occur in the imaging head due to influences of thermal expansion or the like. In this printer, however, because the print stage is driven by the controller under its control, the position matching between the mask sheet and the board is performed precisely by taking the travel error as described above into account.

In addition, as another preferable configuration, the screen printer may be configured in such a manner that: the first imaging device is integrally movable with the print stage; the second imaging device is provided fixedly within a movable region of the print stage; and the controller drives the print stage under control when taking the image of the mask sheet and the image of the board.

When the print stage is driven repetitively, a travel error (an error from a theoretical amount of travel) may possibly occur in the print stage (first imaging device) due to influences of thermal expansion or the like. In this printer, however, because the print stage is driven by the controller under its control, the position matching between the mask sheet and the board is performed precisely by taking the travel error as described above into account.

INDUSTRIAL APPLICABILITY

As has been described, the position matching method and the screen printer of the invention are useful for a printer that superimposes a board and a mask sheet to print paste, such as cream solder, onto the board via opening made in the mask sheet and suitable to maintain a high print quality on boards continuously.

The invention claimed is:

1. A position matching method adapted for a screen printer operable to superimpose a board held on a print stage on a mask sheet to print paste onto the board via the sheet, comprising:

acquiring mask position information and board position information through recognition of images of the mask sheet and the board to perform position matching between the mask sheet and the board according to the board position information and the mask position information before the superimposing operation; and pre-setting a time required for processing a plurality of boards or a number of a plurality of boards to be processed as a mark recognition re-execution condition for acquiring the mask position information;

wherein:

the board position information and the mask position information are acquired when a first board is held on the print stage, the board position information is further acquired when a second and succeeding boards are held on the print stage, the mask position information is acquired when the mark recognition re-execution condition is satisfied—while boards of the same type are continuously produced, and the position matching is performed according to latest mask position information for the next superimposing operation.

2. The position matching method according to claim 1, wherein:
the images of the mask sheet and the board are recognized, using a movable imaging head, and
at least one of the number of times of moving the imaging head, a moving distance of the imaging head, and a temperature change amount of a specific portion of a driving mechanism for driving the imaging head, in addition to the time and the number of the plurality of boards until the mask position information acquiring is pre-set as the mark recognition re-execution condition.

3. A screen printer, comprising:
a mask sheet, a movable print stage disposed below the mask sheet to hold a board to be processed, a first imaging device for taking an image of the mask sheet, and a second imaging device for taking an image of the board to be processed;
a controller configured to control the first and second imaging devices to take an image of the mask sheet and an image of the board while boards of the same type are produced continuously in a manner wherein the second imaging device takes the image of a first board to be held on the print stage, and the first imaging device takes the image of the mask sheet when the first board is held on the print stage,
the second imaging device takes the image of a second board and succeeding boards when they are held on the print stage, and the first imaging device takes the image of the mask sheet each timing when a pre-set mark recognition re-execution condition is satisfied, the pre-set mark recognition re-execution condition being a time required for processing a plurality of boards, or being the number of a plurality of boards to be processed;
a calculator to calculate a mask position and a board position according to a result of the taken images; and
a storage device to store the mask position found by the calculator as an update,
wherein the controller is further configured to drive the print stage under control according to the board position found by the calculator and the mask position stored in the storage device in order to superimpose the board held on the print stage on the mask sheet.

4. The screen printer according to claim 3, further comprising:
an imaging head movable between the mask sheet and the print stage in a spaced apart state, wherein:
the first imaging device and the second imaging device are mounted integrally on the imaging head; and
the controller drives the imaging head under control when taking the image of the mask sheet and the image of the board.

5. The screen printer according to claim 3, wherein:
the first imaging device is integrally movable with the print stage;
the second imaging device is provided fixedly within a movable region of the print stage; and
the controller drives the print stage under control when taking the image of the mask sheet and the image of the board.

6. The screen printer according to claim 4, wherein:
the mark recognition re-execution condition further includes at least one of the number of times of moving the imaging head, and a moving distance of the imaging head until the mask position information acquiring.

7. The screen printer according to claim 6, further comprising:
a driving mechanism for driving the imaging head; and
a temperature detector for detecting a temperature of a specific portion of the driving mechanism, wherein:
the mask recognition re-execution condition further includes a temperature change amount detected by the temperature detector.

* * * * *